Figure 1:
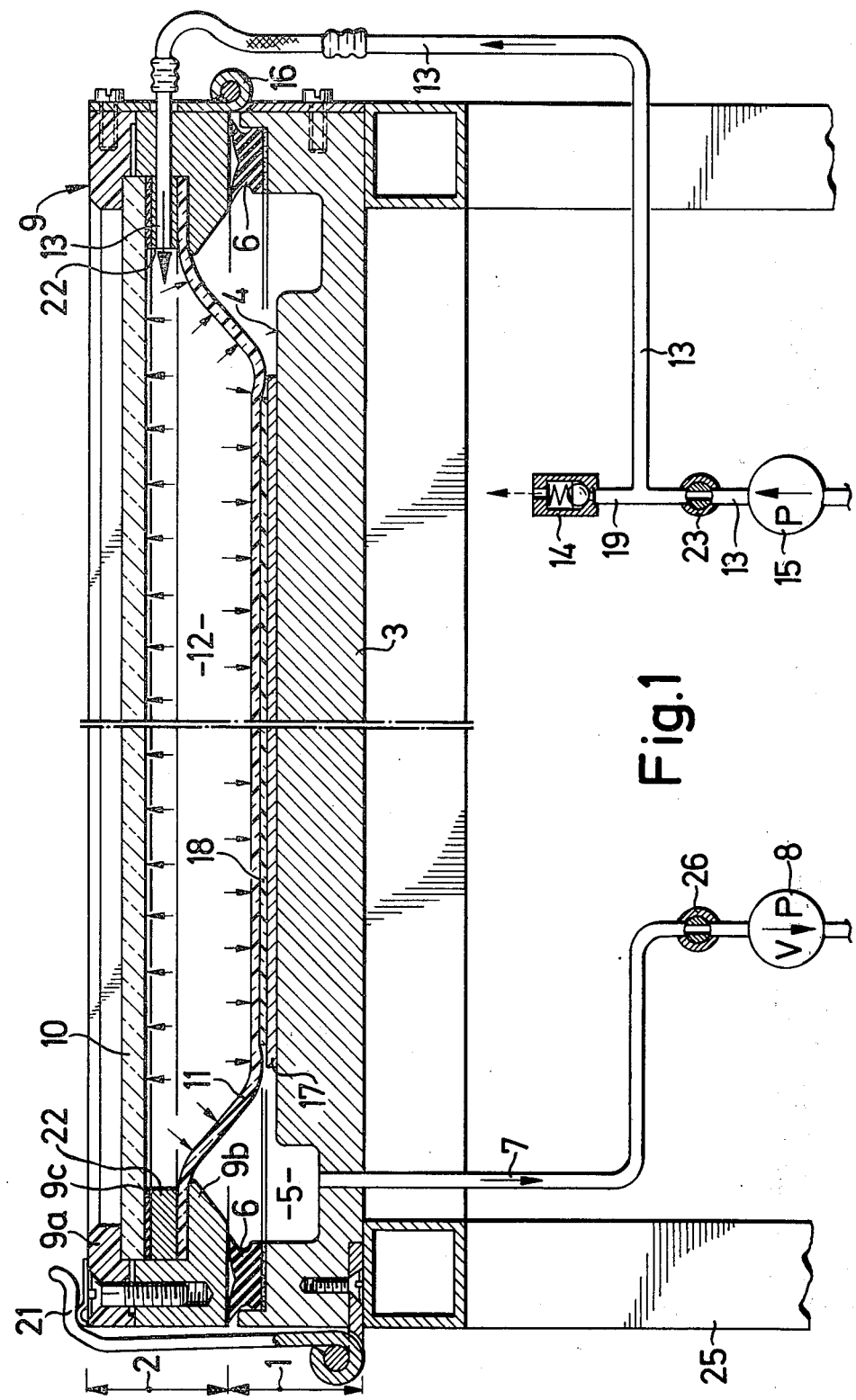

United States Patent [19]

Töpfer

[11] 3,995,955
[45] Dec. 7, 1976

[54] PRINTING FRAME

[75] Inventor: Dieter Töpfer, Wiesbaden-Biebrich, Germany

[73] Assignee: Hoechst Aktiengesellschaft, Germany

[22] Filed: Apr. 28, 1975

[21] Appl. No.: 572,085

[30] Foreign Application Priority Data
Apr. 30, 1974 Germany .................. 7415237[U]

[52] U.S. Cl. ............................. 355/91; 355/76
[51] Int. Cl.² .................................. G03B 27/20
[58] Field of Search .............. 355/76, 91, 92, 93

[56] References Cited
UNITED STATES PATENTS

| | | | |
|---|---|---|---|
| 2,929,309 | 3/1960 | Young | 355/91 |
| 3,359,879 | 12/1967 | Hamlin | 355/93 |
| 3,455,634 | 7/1969 | Guffon | 355/91 |
| 3,604,800 | 9/1971 | Jordan | 355/91 |
| 3,625,611 | 12/1971 | Orr | 355/91 X |
| 3,834,815 | 9/1974 | Greig | 355/91 |

*Primary Examiner*—Joseph F. Peters, Jr.
*Attorney, Agent, or Firm*—James E. Bryan

[57] ABSTRACT

This invention relates to a printing frame for the exposure of printing plates comprising two closable components, flexible sheet means secured to one of said components and being adapted to press a printing plate and an original together and maintain them in close contact during exposure, and means for exerting air pressure on said flexible sheet means in order to press said printing plate and original together.

5 Claims, 3 Drawing Figures

PRINTING FRAME

It is known to lock an original and a printing plate in close contact with each other for exposure to light, by compressing them, with the aid of a flexible foil or blanket, in a printing frame composed of two components which are capable of being closed. If exposure is made from above, the printing plate is positioned upon a flexible support, for example a rubber blanket, the original is placed on top, and the entire sandwich is then compressed by means of a glass plate. If exposure is made from below, the original is placed upon a planar, transparent support (glass plate), the printing plate is superimposed, and then an elastic blanket (rubber blanket) is placed on top and the entire sandwich is compressed.

In spite of the fact that an elastic supporting or cover sheet is used, the original and the printing plate are not compressed as uniformly as would be desirable in many cases if no vacuum is applied. On the other hand, the improving effect of the vacuum, if one is applied, normally develops its full action only when the pressure is gradually reduced, over a period of several minutes, and this frequently renders the preparation for the exposure process undesirably time-consuming.

It is the object of the present invention to provide a printing frame which improves the compression of the original and the printing plate, if no reduced pressure is applied, and shortens the preparation time for the exposure process, if a vacuum is additionally applied. This object is achieved by making use of a known printing frame composed of two closable components, provided with a flexible cover or supporting sheet, which is part of one of the components, and which serves to press the printing plate and the original upon each other and maintain them in close contact during the exposure process, if desired with the aid of reduced pressure. According to the present invention, the printing frame used for solving the present problem is provided with an air cushion and the flexible cover or supporting sheet is part of the air cushion. When the two components of the printing frame are closed, the original and the air cushion are pressed upon each other between the components. The air cushion guarantees a contact without air bubbles between the original and the printing plate, in particular when the air cushion is, after the introduction of the printing plate and the original in the printing frame, first contacted with a small area in the center of the printing plate and this area is then extended over the entire surface of the printing plate.

A particularly advantageous embodiment is a printing frame composed of two closable components with a flexible supporting sheet arranged between them. By means of this sheet and the closing of the two components the printing plate and the original are pressed upon each other and maintained in this position during the exposure process, preferably with the aid of reduced pressure, the space between the flexible supporting sheet and the first component, in which the printing plate and the original are situated, being evacuated.

Figure 2:
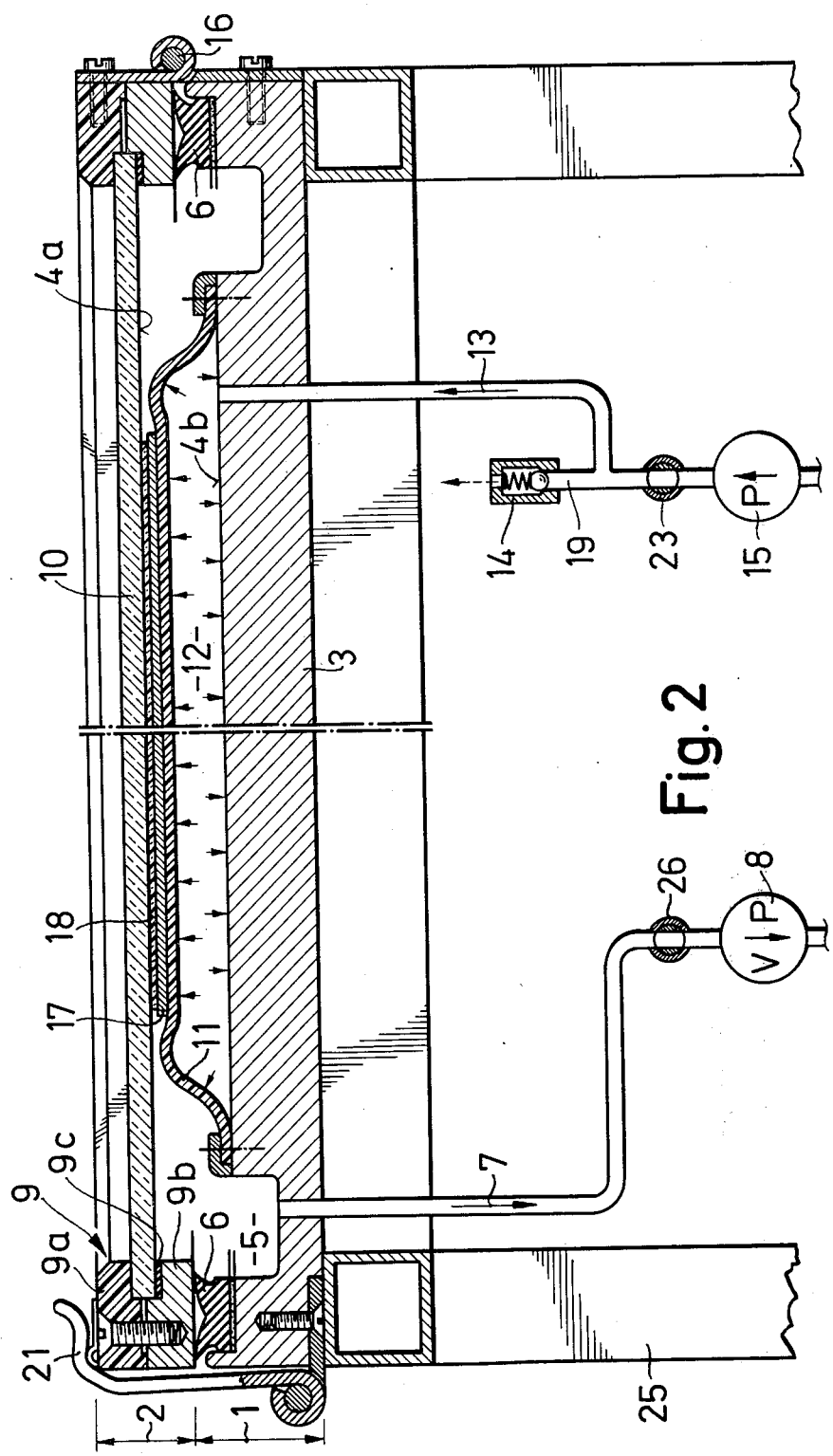

This embodiment is characterized in that the supporting sheet on the second component of the printing frame is fixed by the creation of an air cushion and that the first component of the printing frame is transparent through the original (FIG. 2). This embodiment has the essential advantage that the copying light does not reach the printing plate, which is pressed against the original, through a flexible cover sheet but through the first component of the printing frame the construction of which includes a non-light-scattering glass plate which has practically no optical influence. The material of which the flexible supporting sheet is composed and the shape of this supporting sheet do not matter as far as optics go. Therefore the supporting sheet may preferably be composed of non-transparent rubber.

The printing frame is advantageously used in the following manner:

At first the printing plate and the original are introduced in the space created between the flexible supporting sheet and the first and transparent component in such a manner that the transparent original is situated between the transparent component and the printing plate. Subsequently the cushion and then the space between the flexible supporting sheet and the first component are evacuated. During this process the flexible supporting sheet is pressed by the weight of the printing plate and of the original. Then at least atmospheric pressure is created in the interior of the air cushion, so that the printing plate and the original are lifted by the flexible supporting sheet and pressed against the transparent first component. Since the space in which the printing plate and the original are situated is evacuated during the pressing process this process can be carried out very rapidly without causing air bubbles between the printing plate and the original or between the original and the transparent first component.

Advantageously, the interior of the air cushion is provided with an air conduit which leads from the cushion and is equipped with a shut-off device, so that, if desired, the air content of the air cushion may be increased or reduced. In a particularly advantageous embodiment, the air conduit is connected with an air pump. The air pump may be controlled, for example by an automatic switch, so that the pressure in the air cushion may be maintained at a desired value, for example when the two components of the printing frame are opened. It is also very advisable to provide the air conduit with an excess pressure release valve which guarantees that the pressure maintained in the air cushion does not exceed a certain value, for example when the two components are closed. Most advantageously, the air conduit is connected both to an air pump and to an excess pressure release valve, or to other devices of corresponding effect. If desired, the interior of the air cushion may be connected with the atmosphere or with a ventilating system by more than one air conduit provided with shut-off devices.

The invention also covers printing frames which, in addition to the air cushion and its accessories, comprise elements which serve to press the original and the printing plate upon each other by means of a vacuum. In printing frames equipped in this manner, the original and the printing plate are initially pressed upon each other by means of the air cushion when the two components of the printing frame are closed. By the action of the air cushion, air bubbles between the original and the printing plate are substantially forced out, so that the effect of the vacuum may reach its optimum value within a very short time.

The accompanying drawings illustrate three embodiments of the present invention.

Figure 2A:
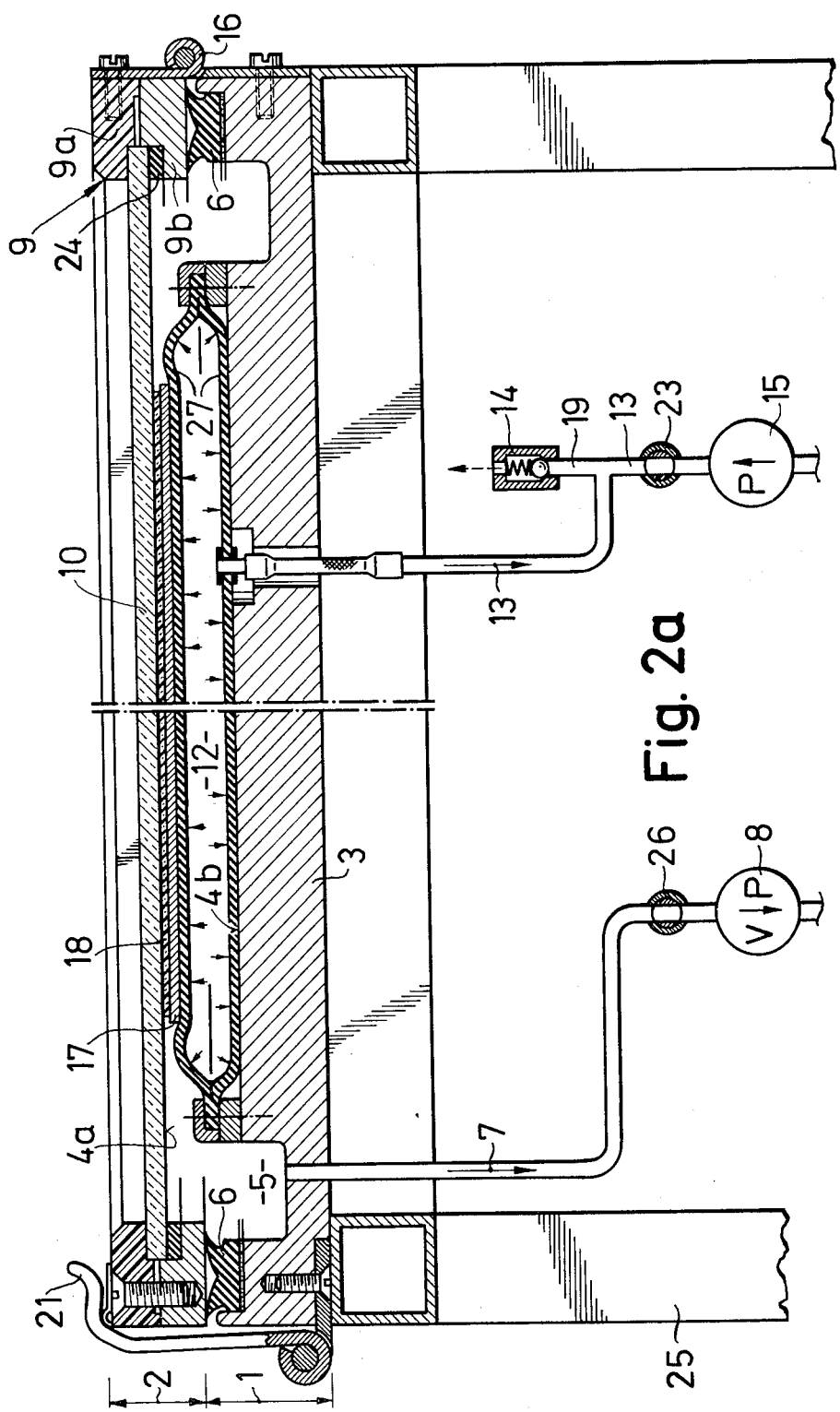

FIG. 1 shows a printing frame with an air cushion which is part of its upper component, FIG. 2 shows a printing frame with an air cushion which is part of the lower component of the frame, and FIG. 2a shows a variation of FIG. 2 in which the air cushion is composed of a sack.

In all three cases, exposure is effected through the upper component of the printing frame.

The printing frame shown in FIG. 1 is composed of a lower component 1 and an upper component 2. The lower component 1 includes a base plate 3, which may be arranged on a support 25 and which has a ground surface 4, and a suction space 5 which surrounds the base plate 3 and is, in turn, surrounded by a packing 6 and connected with a vacuum pump 8 by means of an evacuation duct 7 which can be shut off by means of a valve 26.

The upper component 2 includes a frame 9a, 9b, a glass plate 10 air-tightly embedded in the frame 9a, 9b by means of a packing 9c, a transparent, air-tight, flexible plastic foil 11 which is air-tightly embedded in the frame 9a, 9b together with the glass plate 10 or whose edges are air-tightly cemented to the frame 9, so that an air cushion 12 may be formed between the glass plate 10 and the plastic foil 11, and a branched air conduit 13 which may be connected, for example, to a spacing frame 22 and one branch of which leads to an air vent 19, preferably shut off by an excess pressure release valve 14, whereas the other branch is connected to an air compressor 15. The compressed-air conduit 13 can be shut off by means of a valve 23.

The lower component 1 and the upper component 2 are connected with each other by a hinge 16 and detachable connecting elements 21 and may be opened and closed by turning on the hinge 16. A printing plate 17 rests upon the base plate 3 and the original 18 is positioned on the printing plate. In FIG. 1, the two components of the frame are closed, so that the original and the printing plate are pressed upon each other by the air cushion 12. It is also possible to close and open the printing frame by lifting instead of turning its upper and lower components on a hinge.

The embodiment of the invention shown in FIG. 2 differs from that shown in FIG. 1 in that the air cushion 12 is formed by a plastic foil 11 and the base plate 3 to which the plastic foil 11 is air-tightly fastened on all sides. Consequently, the compressed-air conduit 13 with the shut-off device (valve 23), which connects the air cushion 12 with the outside, is passed through the base plate 3. In this embodiment of the invention, the lower surface 4a of the glass plate 10 is advantageously surface-ground, whereas a surface grinding of the surface 4b of the base plate 3 can be dispensed with.

Printing frames of a similar construction in which exposure is effected from below also are within the scope of the present invention.

In the embodiment according to FIG. 2a the air cushion 12 may also be composed of, for example, a double rubber blanket or a sack 27 and does not have to be a plastic foil in this case.

It will be obvious to those skilled in the art that many modifications may be made within the scope of the present invention without departing from the spirit thereof, and the invention includes all such modifications.

What is claimed is:

1. In a printing frame for the exposure of printing plates comprising two closable components, flexible sheet means secured to one of said components and being adapted to press a printing plate and an original together and maintain them in close contact during exposure, and means for exerting air pressure on said flexible sheet means in order to press said printing plate and original together, the improvement comprising sack means formed by said flexible sheet means, and conduit means connected to the sack.

2. A printing frame according to claim 1 in which at least a portion of one of said closable components is transparent and the sack means is secured to the other one of said closable components.

3. A printing frame according to claim 1 including shut-off means in conduit means.

4. A printing frame according to claim 1 including air compressor means and air vent means connected to said conduit means.

5. A printing frame according to claim 4 including excess pressure release valve means connected to said air vent means.

* * * * *